(12) United States Patent
Liao et al.

(10) Patent No.: US 10,522,385 B2
(45) Date of Patent: Dec. 31, 2019

(54) WAFER TABLE WITH DYNAMIC SUPPORT PINS

(71) Applicant: Taiwan Semiconductor Manufacturing Co., Ltd., Hsinchu (TW)

(72) Inventors: Chi-Hung Liao, Taipei County (TW); Min-Cheng Wu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/716,042

(22) Filed: Sep. 26, 2017

(65) Prior Publication Data
US 2019/0096734 A1 Mar. 28, 2019

(51) Int. Cl.
*H01L 21/687* (2006.01)
*G03F 7/20* (2006.01)
(Continued)

(52) U.S. Cl.
CPC .......... *H01L 21/6875* (2013.01); *G03F 7/707* (2013.01); *G03F 7/70783* (2013.01); *G03F 7/70866* (2013.01); *H01L 21/027* (2013.01); *H01L 21/67259* (2013.01); *H01L 21/67282* (2013.01); *H01L 21/67288* (2013.01); *H01L 21/6838* (2013.01); *H01L 21/68742* (2013.01); *H01L 21/68757* (2013.01); *H01L 22/20* (2013.01); *H01L 22/24* (2013.01); *H01L 23/544* (2013.01); *H01L 22/12* (2013.01)

(58) Field of Classification Search
None
See application file for complete search history.

(56) References Cited

U.S. PATENT DOCUMENTS 5,231,291 A    7/1993  Amemiya et al.
5,563,684 A *  10/1996 Stagaman ............. G03B 27/58
                                                    355/47

(Continued)

FOREIGN PATENT DOCUMENTS

CN    104900571 A    9/2015
JP    2007123560     5/2007
(Continued)

OTHER PUBLICATIONS

US 5,817,244 A1, 11/2004, Platt (withdrawn)

*Primary Examiner* — Khaja Ahmad
(74) *Attorney, Agent, or Firm* — Haynes and Boone, LLP

(57) ABSTRACT

A method for semiconductor fabrication includes mounting a wafer onto a first wafer table. The first wafer table includes a first set of pins that support the wafer, the first set of pins having a first pitch between adjacent pins. The method further includes forming a first set of overlay marks on the wafer; and transferring the wafer onto a second wafer table. The second wafer table includes a second set of pins having a second pitch between adjacent pins. The second set of pins are individually and vertically movable, and the second pitch is smaller than the first pitch. The method further includes moving a portion of the second set of pins such that a remaining portion of the second set of pins supports the wafer and the remaining portion has the first pitch between adjacent pins.

20 Claims, 10 Drawing Sheets

(51) Int. Cl.
  *H01L 21/027* (2006.01)
  *H01L 21/66* (2006.01)
  *H01L 21/67* (2006.01)
  *H01L 23/544* (2006.01)
  *H01L 21/683* (2006.01)

(56) References Cited

U.S. PATENT DOCUMENTS

| | | | |
|---|---|---|---|
| 6,030,887 A * | 2/2000 | Desai | C30B 29/06 |
| | | | 257/E21.218 |
| 6,543,513 B1 | 4/2003 | Lau et al. | |
| 6,805,338 B1 * | 10/2004 | Okuda | H01L 21/6838 |
| | | | 269/21 |
| 7,110,085 B2 | 9/2006 | Zaal et al. | |
| 7,411,384 B2 | 8/2008 | Ogasawara et al. | |
| 7,749,792 B2 | 7/2010 | Fedder et al. | |
| 8,068,208 B2 | 11/2011 | Peng et al. | |
| 8,264,662 B2 | 9/2012 | Chen et al. | |
| 8,950,257 B2 | 2/2015 | Cazzaniga et al. | |
| 9,575,415 B2 | 2/2017 | Chen et al. | |
| 2002/0104229 A1 * | 8/2002 | Shin | H01L 21/67259 |
| | | | 33/645 |
| 2003/0001103 A1 * | 1/2003 | Kobayashi | B25B 11/005 |
| | | | 250/440.11 |
| 2004/0031338 A1 * | 2/2004 | Chen | H01L 21/67259 |
| | | | 73/865.9 |
| 2004/0142571 A1 * | 7/2004 | Yanagisawa | H01L 21/31055 |
| | | | 438/690 |
| 2007/0236857 A1 * | 10/2007 | Lin | H01L 21/67259 |
| | | | 361/234 |
| 2007/0288219 A1 * | 12/2007 | Zafar | G03F 1/84 |
| | | | 703/14 |
| 2008/0068580 A1 * | 3/2008 | Mori | G03F 7/707 |
| | | | 355/72 |
| 2008/0304025 A1 | 12/2008 | Chang et al. | |
| 2011/0218483 A1 | 9/2011 | Hunter | |
| 2013/0182255 A1 * | 7/2013 | Zhou | G03F 7/70633 |
| | | | 356/401 |
| 2013/0276705 A1 * | 10/2013 | Kato | C23C 16/4584 |
| | | | 118/725 |
| 2014/0097175 A1 | 4/2014 | Yu et al. | |
| 2015/0197846 A1 | 7/2015 | Sung | |
| 2016/0023356 A1 * | 1/2016 | Hara | H01L 21/67259 |
| | | | 355/72 |
| 2016/0225650 A1 | 8/2016 | Komine et al. | |
| 2016/0293471 A1 * | 10/2016 | Shang | H01L 21/681 |
| 2017/0068318 A1 * | 3/2017 | McClure | G06F 3/016 |
| 2018/0131293 A1 * | 5/2018 | Wang | G01R 31/2808 |

FOREIGN PATENT DOCUMENTS

| | | |
|---|---|---|
| JP | 2008171892 | 7/2008 |
| KR | 20130139737 | 12/2013 |
| TW | 200737396 A | 10/2007 |
| TW | 200818385 | 4/2008 |
| TW | 201232694 A | 8/2012 |

* cited by examiner

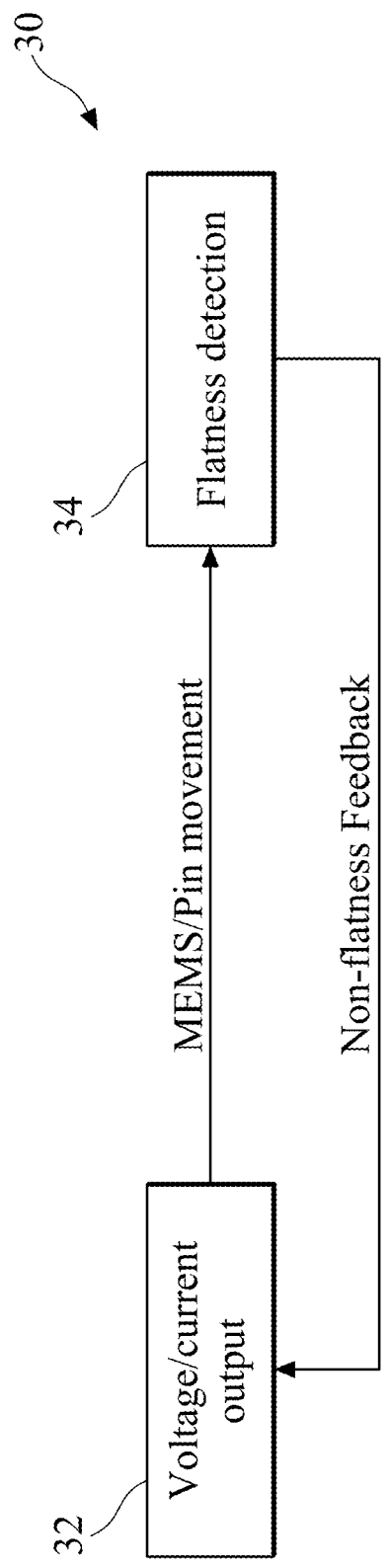
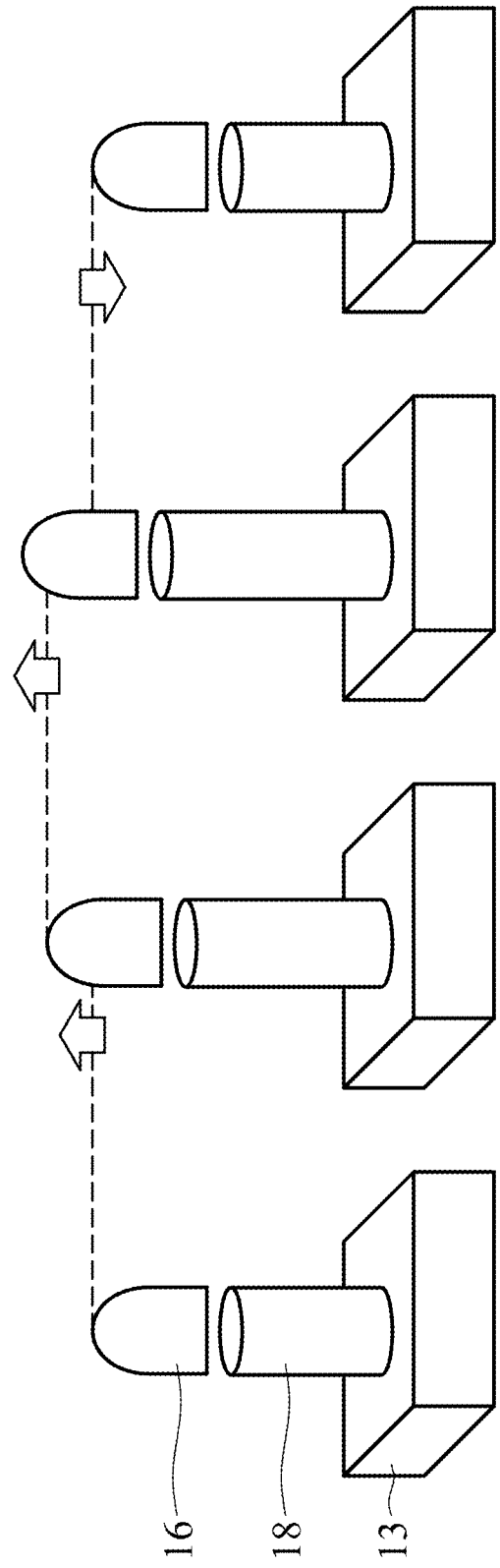
FIG. 2A
FIG. 2B  FIG. 2C  FIG. 2D  FIG. 2E

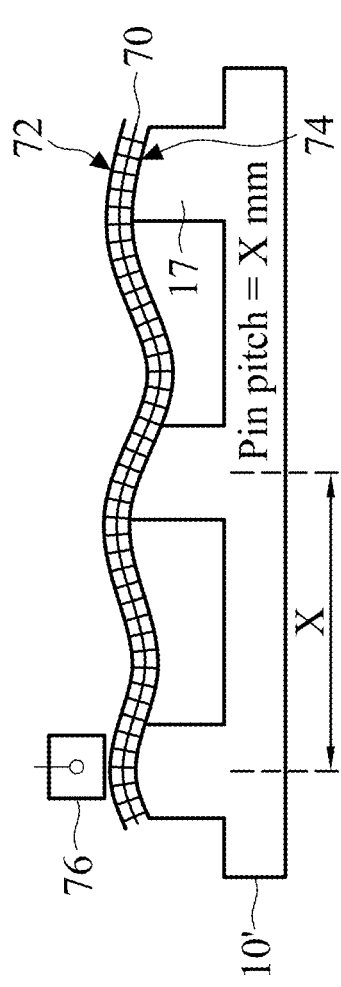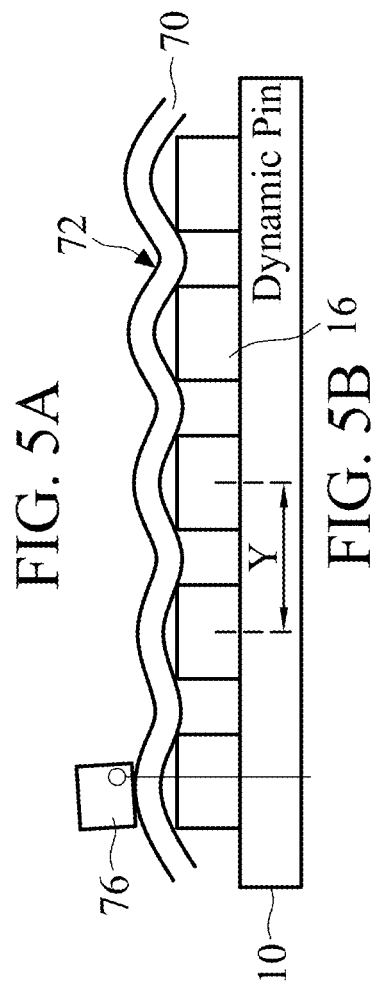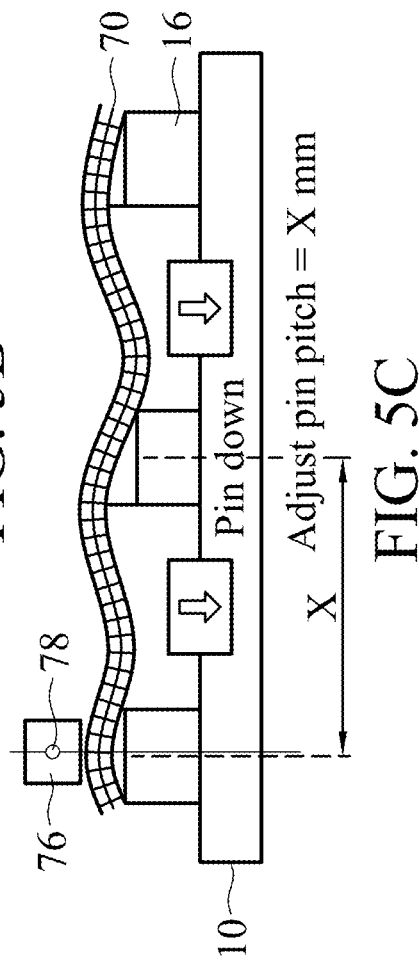

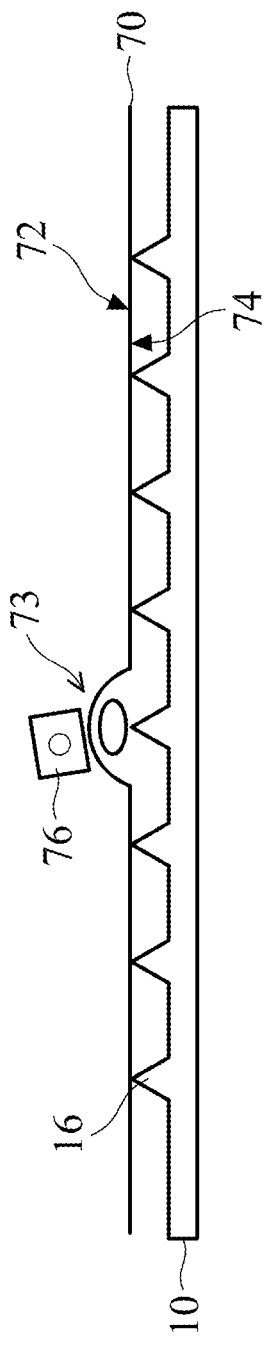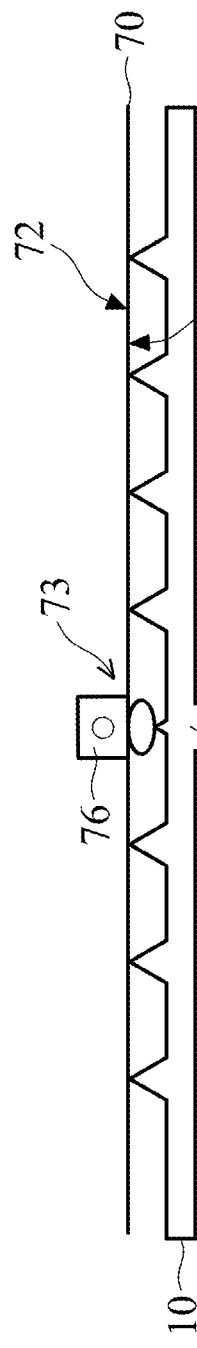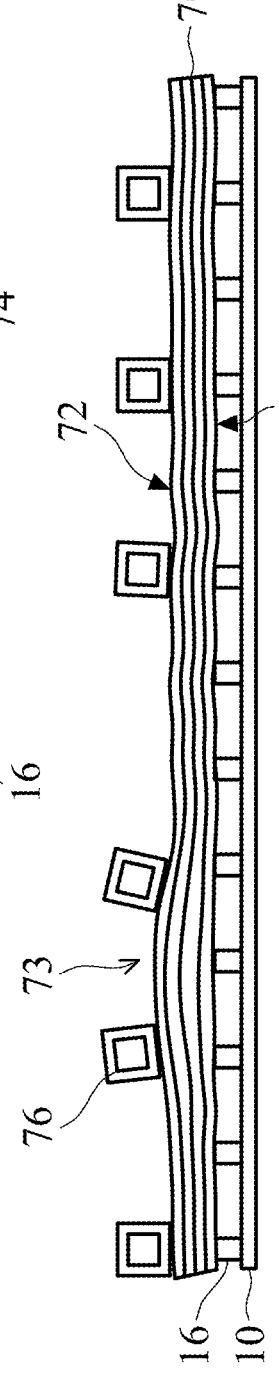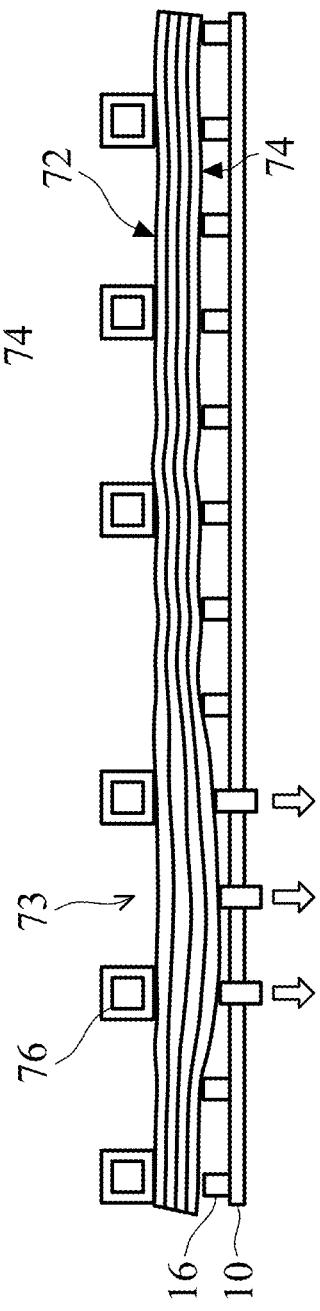

WAFER TABLE WITH DYNAMIC SUPPORT PINS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, this scaling down process has placed higher requirements on the flatness of a wafer surface because relatively small non-flatness (e.g., a dip or a bump) in the wafer surface might cause layer misalignment or even circuit defects. As wafer size gets larger (e.g., from 200 mm to 300 mm), the issue of local non-flatness becomes more prominent. Existing semiconductor fabrication equipment and methods do not seem to address this issue satisfactorily. Accordingly, improvements in this area are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A, 2B, 2C, 2D, and 2E illustrate a movement mechanism of the individually movable support pins of the wafer table of FIGS. 1A-1B, in accordance with some embodiments.

FIGS. 5A, 5B, and 5C illustrate some operations of the method of FIG. 4, in accordance with some embodiments.

FIGS. 7A, 7B, 8A, and 8B illustrate some operations of the method of FIG. 6, in accordance with some embodiments.

DETAILED DESCRIPTION

Figure 1A:
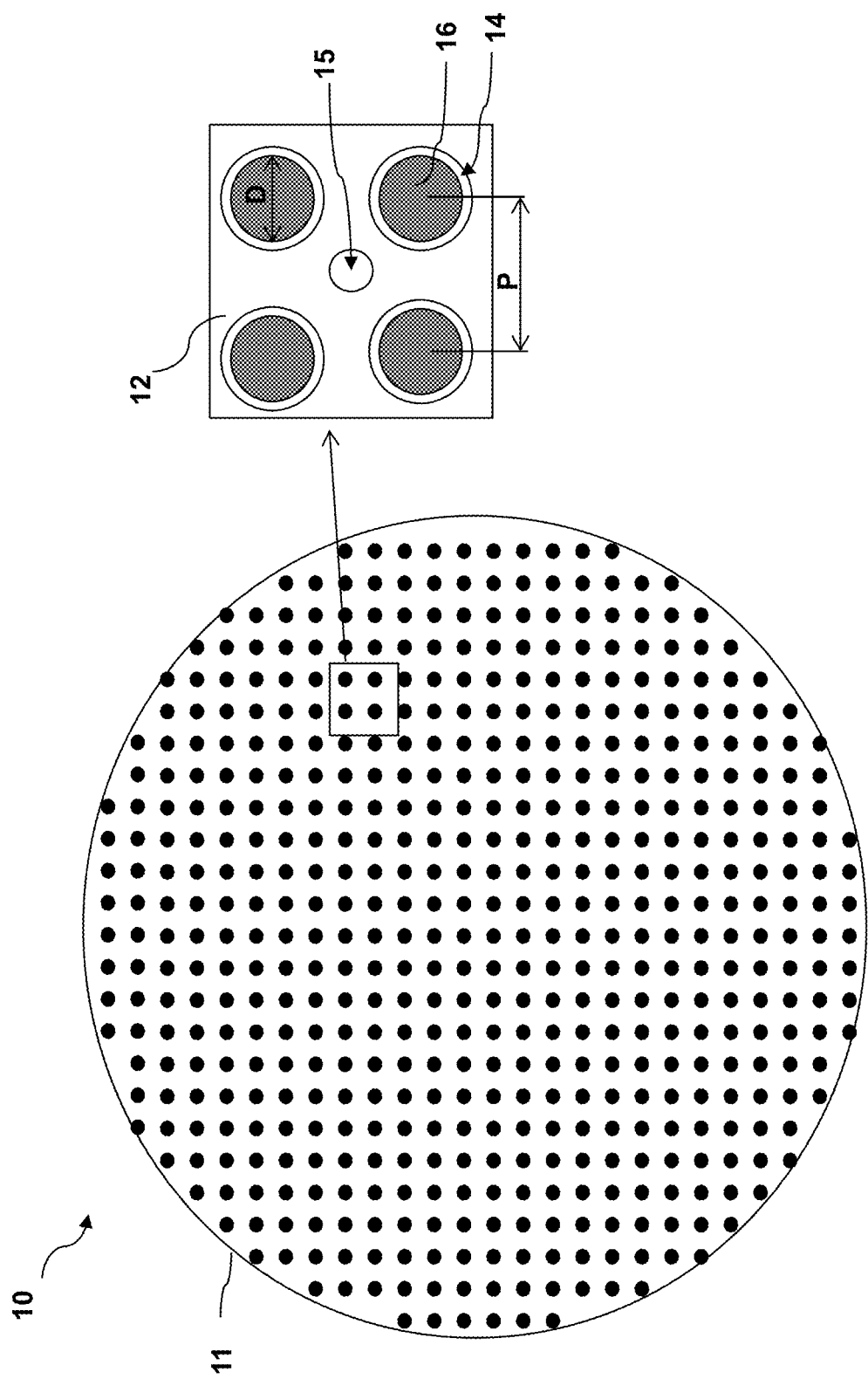
FIG. 1A shows a top view of a part of a wafer table having individually movable support pins in some embodiments, constructed according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor fabrication equipment and processes, and more particularly related to wafer tables and methods of using the same. In an embodiment of the present disclosure, a wafer table is designed to have wafer support pins that are individually (independent of each other) and vertically (perpendicular to a wafer surface supported thereon) movable. These movable support pins are evenly distributed across an area of the wafer table that is larger (or slightly larger) than a wafer. The wafer may have a size of 200 mm, 300 mm, 450 mm, or other suitable sizes; and the wafer table may be tailored for one such size or made compatible for multiple of these sizes. Each of the wafer support pins can be moved up or down with a discrete step adjustment or a continuous height adjustment. In an exemplary fabrication method, a wafer is supported on the wafer table by the wafer support pins, non-flatness on a wafer surface opposite the wafer support pins is detected, and one or more of the wafer support pins are adjusted in their heights to cause the non-flatness to reduce in magnitude or to totally disappear. The non-flatness in the wafer surface may be caused by particle adsorption or uneven material distribution in the layers of the wafer. In principle, a wafer is not completely rigid, but has certain flexibility. By supporting a wafer with pins of various heights, the surface of the wafer on the opposite side can be adjusted to counteract the surface non-flatness. Many other semiconductor fabrication processes may benefit from the innovative wafer table according to the present disclosure. Embodiments of the wafer table, as well as processes of using the same, are further discussed below.

Figure 1B:
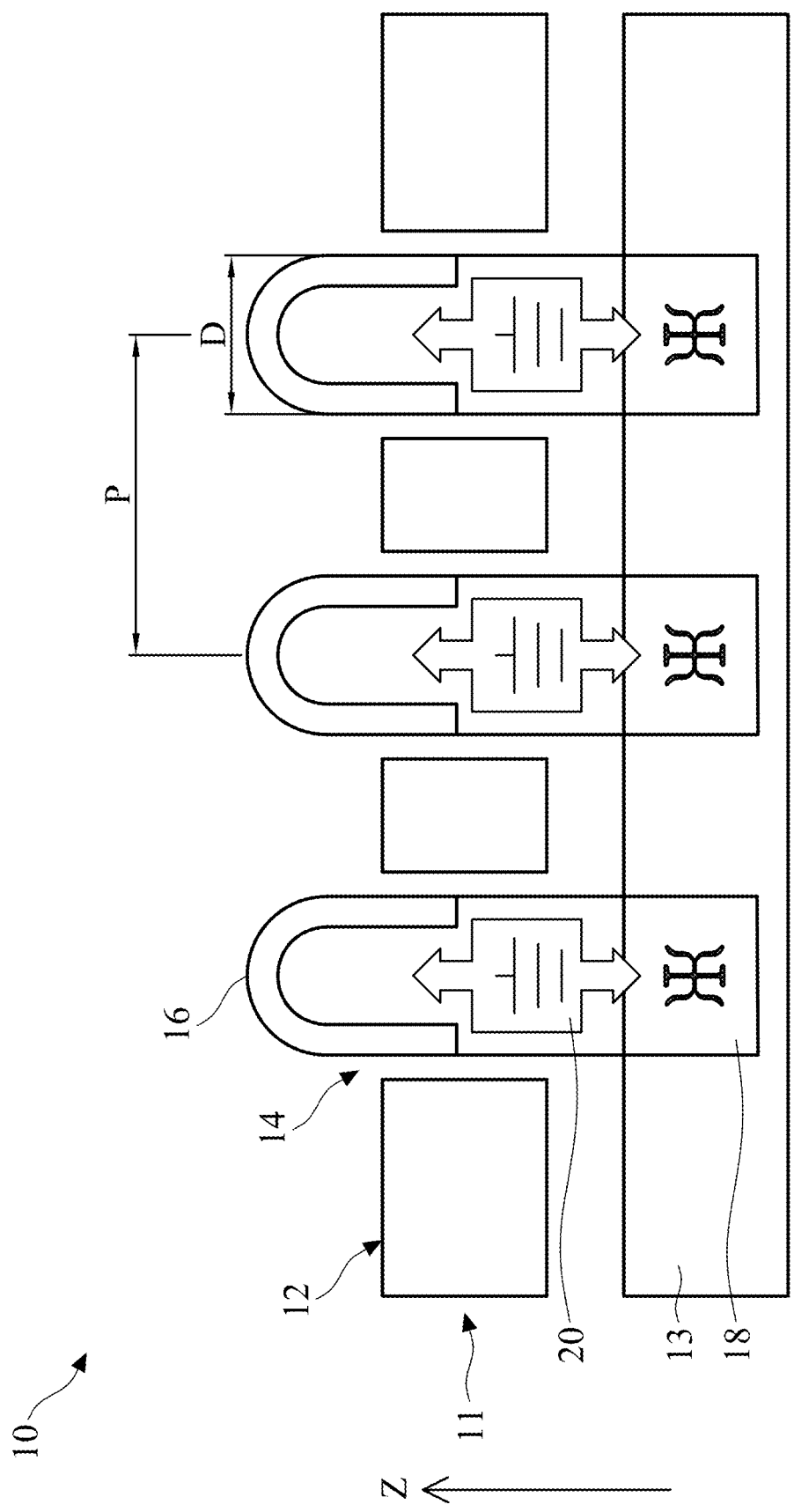
FIG. 1B illustrates a side cross-sectional view of a portion of the wafer table of FIG. 1A, in accordance with some embodiments.

FIG. 1A illustrates a top view of a wafer table 10 (on the left of the figure) constructed according to aspects of the present disclosure. FIG. 1A also illustrates a blown-up view of portions of the wafer table 10 (on the right of the figure). FIG. 1B illustrates a portion of the wafer table 10 in cross-sectional view in accordance with an embodiment. Referring to FIGS. 1A and 1B collectively, the wafer table 10 includes a plate 11 that may be made of a rigid material, such as silicon carbide (SiC) including crystalline or polycrystalline silicon carbide, ceramic silicon carbide, or non-oxide ceramic silicon carbide (SiSiC or SSiC). An upper surface 12 of the plate 11 includes a circular region (i.e., the circular area in the left side of FIG. 1A or a portion thereof) that is larger than the size of a wafer to be supported by the wafer table 10. For example, the size of the wafer may be 200 mm, 300 mm, or 450 mm in diameter, or other suitable wafer sizes; and the circular region has a slightly larger diameter.

The wafer table 10 includes an array of holes 14 that are evenly distributed across the entire area of the circular region and through the plate 11. Inside each hole 14, there is a pin (or support pin or wafer support pin) 16 that can be moved up or down (out or into the paper of FIG. 1A or along the vertical direction Z of FIG. 1B). The pins 16 make up an array that is evenly distributed across the entire area of the circular region. Each pin 16 is made of a rigid material, such as silicon carbide (SiC) including crystalline or polycrystalline silicon carbide, ceramic silicon carbide, or non-oxide ceramic silicon carbide (SiSiC or SSiC). In an embodiment, the plate 11 and the pins 16 are made of the same material. In an alternative embodiment, the plate 11 and the pins 16 may be made of different materials. In the present embodiment, the pins 16 are of the same size with a diameter D that may range from less than one micron to few millimeters in various embodiments. The pins 16 are spaced apart with a pitch P that may range from slightly more than D to a few times more than D.

Still referring to FIG. 1A, the wafer table 10 further includes a plurality of suction holes 15 through the plate 11. In the present embodiment, the number of suction holes 15 is far fewer than the number of pins 16. The suction holes 15 are placed in selected locations of the wafer table 10 and between the holes 14. Further, the suction holes 15 are smaller in size than the holes 14 in the present embodiment. The suction holes 15 are used by a vacuum suction system that produces a downward suction force to a wafer supported by the pins 16. The vacuum system and the pins 16 collectively keep the wafer stably in place.

Referring to FIG. 1B, the wafer table 10 further includes another plate 13 underneath the plate 11. The plates 11 and 13 may be connected or even made into one structure in some embodiments. Alternatively, the plates 11 and 13 are separate plates. The plate 13 includes a mechanism 18 underneath each pin 16. The mechanism 18 and the respective pin 16 are linked by a linkage 20. In some embodiment, the mechanism 18 is directly coupled to the respective pin 16 without the linkage 20. The mechanism 18 is operable to produce vertical movement that is subsequently transferred to the pin 16 directly or through the linkage 20. In an embodiment, the mechanism 18 includes a MEMS (Micro Electro Mechanical System) structure capable of producing that vertical movement. For example, the MEMS structure may be a MEMS electrical actuator, a MEMS magnetic actuator, a MEMS thermal actuator, or other types of MEMS structure. The wafer table 10 may include a controller (not shown) which is operable to control the various mechanisms 18 to raise or lower the pins 16 based on an input control file.

FIGS. 2A-2E illustrate a movement mechanism of one of the individually movable pins 16 driven by a MEMS structure 18 that changes its volume based on a voltage or a current applied thereto. FIG. 2A illustrates a flow chart of a method 30 for adjusting the height of a pin 16. The method 30 includes an operation 32 for applying voltage or current to the MEMS structure 18, which produces movement in the MEMS structure 18 and the pin 16. The method 30 also includes an operation 34 for detecting flatness (or non-flatness) in a wafer surface supported by the pin 16. The method 30 further includes a feedback loop from the operation 34 to the operation 32. FIGS. 2B-2E illustrate a movement of the pin 16 as a result of the volume change in the MEMS structure 18. The method 30 is further discussed below in conjunction with FIGS. 2B-2E.

At the operation 32, a voltage or current is applied to the MEMS structure 18 (e.g., by a controller not shown) to cause its volume to increase from its state in FIG. 2B to its state in FIG. 2C. This causes the pin 16 to move up vertically. At the operation 34, the flatness of a wafer surface supported by the wafer table 10 is detected (e.g., by optical sensors or leveling sensors). Then, the surface non-flatness is fed back to the operation 32 to adjust (increase or decrease) the voltage or current applied to the MEMS structure 18. The adjustment in the voltage or current causes the volume of the MEMS structure 18 to either increase (such as illustrated in FIG. 2D) or decrease (such as illustrated in FIG. 2E), In an embodiment, increasing voltage or current to the MEMS structure 18 increases its volume, and decreasing voltage or current to the MEMS structure 18 decreases its volume. In an alternative embodiment, increasing voltage or current to the MEMS structure 18 decreases its volume, and decreasing voltage or current to the MEMS structure 18 increases its volume. Either embodiment may be utilized by the wafer table 10 to create the vertical movement in the pins 16.

Figure 3:
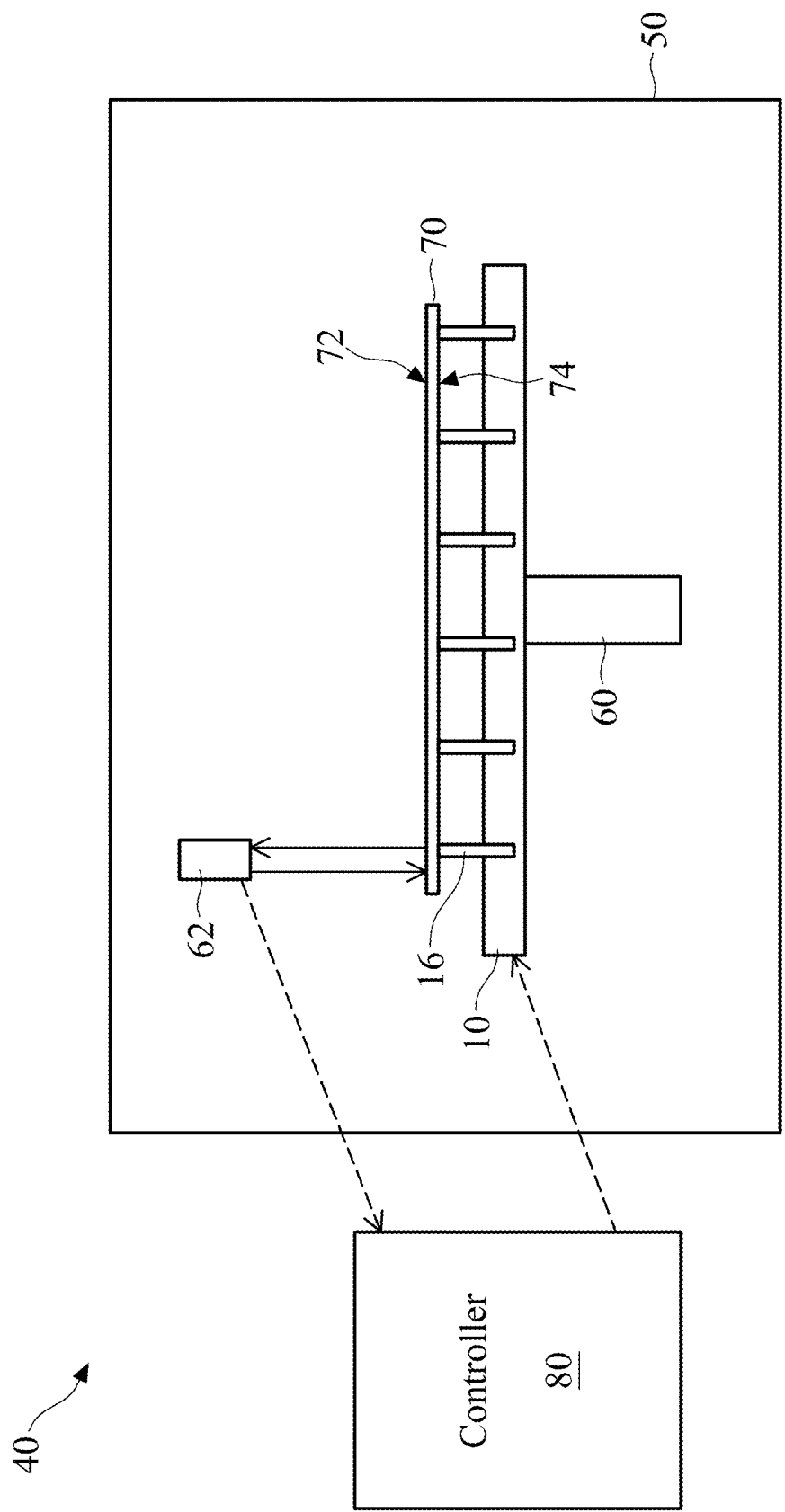
FIG. 3 illustrates an example semiconductor fabrication system that includes an embodiment of the wafer table of FIGS. 1A-1B.

FIG. 3 illustrates a system 40 for wafer fabrication that utilizes the wafer table 10 having individually and vertically movable support pins 16, in accordance with an embodiment. Referring to FIG. 3, the system 40 includes a process chamber 50, the wafer table 10 having the pins 16 inside the process chamber 50, a motion mechanism 60 coupled to the wafer table 10, and one or more optical sensors 62. FIG. 3 further illustrates a wafer 70 supported by the pins 16 inside the process chamber 50. The wafer 70 has a first surface 72 and a second surface 74, wherein the second surface 74 is contacted by the pins 16. The system 40 may further include a vacuum suction system (not shown) that produces a downward suction force onto the surface 74 through the suction holes 15 on the wafer table 10 (see FIG. 1A). The downward suction force and the upward support force by the pins 16 collectively keep the wafer 70 in place.

The process chamber 50 may be used for performing one or more photolithography operations to the wafer 70, such as photoresist coating, photoresist exposing, material deposition, material etching, epitaxy, and other suitable operations. The motion mechanism 60 is operable to drive the wafer table 10 and the wafer 70 secured thereon in various motion modes, such as spinning, lateral (or horizontal) movement, and/or vertical movement. The optical sensors 62 may be the leveling sensors employed by traditional photolithography scanners. In the present embodiment, the optical sensors 62 are operable to detect the flatness (or non-flatness) of the wafer surface 72. The system 40 further includes a controller 80. In an embodiment, the controller 80 is operable to communicate with the optical sensors 62 to obtain the data regarding the flatness of the wafer surface 72. The controller 80 is further operable to communicate with the wafer table 10 for adjusting the height of each individual pin 16. In an embodiment, the system 40 may implement the method 30 of FIG. 2A wherein the feedback loop in FIG. 2A may be implemented by the controller 80. In an embodiment, the controller 80 may be implemented as a computer with software running thereon. For example, the controller 80 may include a microprocessor, an input device, a memory device, and a communication device interconnected by one or more buses; and may execute software instructions for accessing data from the optical sensors 62 and for issuing commands to the wafer table 10 or directly controlling the pins 16 on the wafer table 10.

Figure 4:
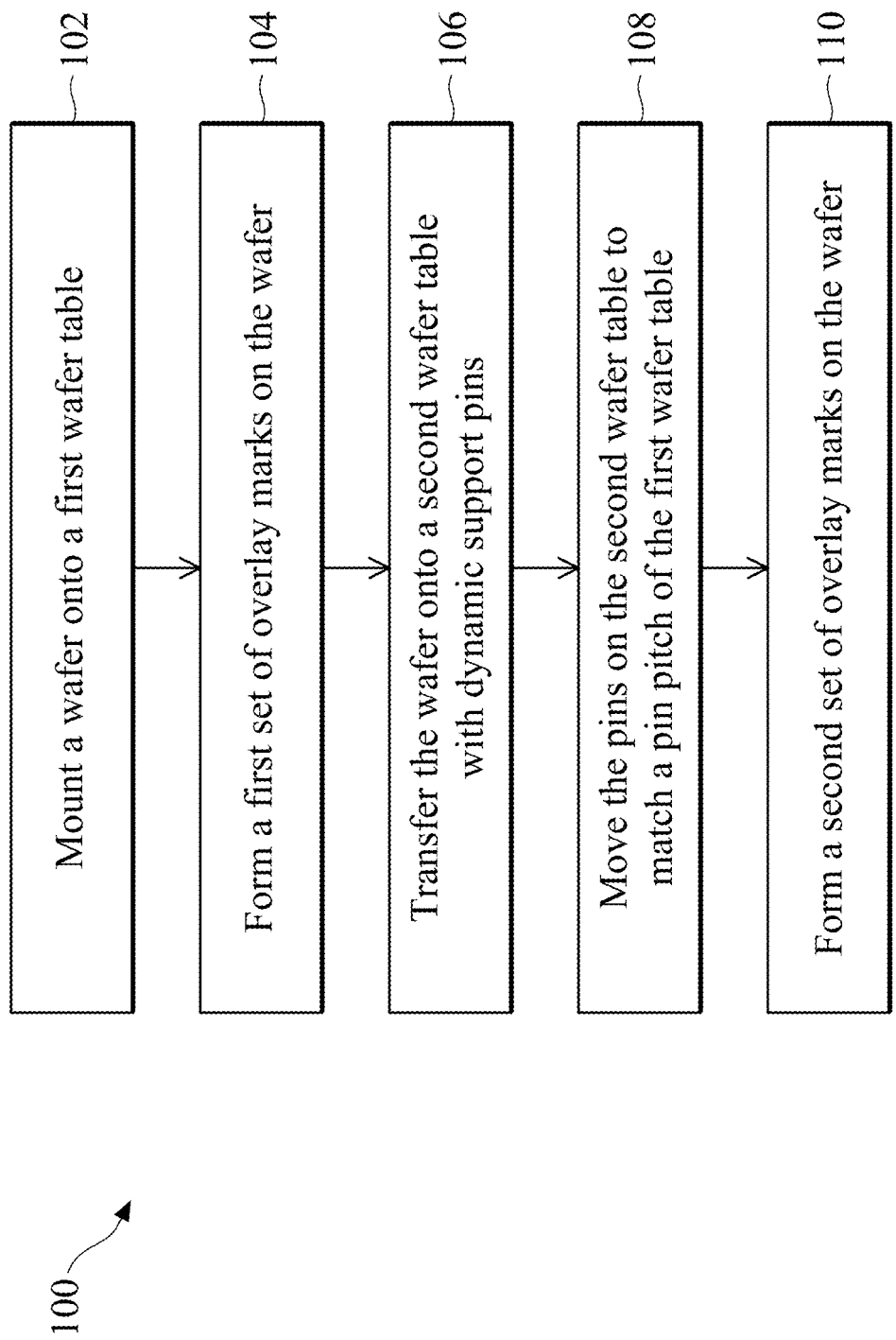
FIG. 4 shows a flow chart of a semiconductor fabrication process according to some aspects of the present disclosure that utilizes an embodiment of the wafer table of FIGS. 1A-1B.

FIG. 4 illustrates a flow chart of a method 100 for manufacturing one or more wafers, according to aspects of the present disclosure. The method 100 takes advantage of the capability of the wafer table 10 to improve wafer yield. In a brief overview, the method 100 includes an operation 102 to mount a wafer onto a first wafer table having a first pin pitch, an operation 104 to form a first set of overlay marks on the wafer, an operation 106 to transfer the wafer onto a second wafer table with dynamic support pins, an operation 108 to move the dynamic support pins on the second wafer table to match the first pin pitch, and an operation 110 to form a second set of overlay marks on the wafer. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is further described below in conjunction with FIGS. 5A-5C.

At the operation 102, the method 100 (FIG. 4) mount a wafer 70 onto a wafer table 10' as illustrated in FIG. 5A. The wafer table 10' may be housed in a process chamber (not shown). The wafer table 10' includes a plurality of wafer support pins 17 that have a pin pitch X. In an embodiment, the wafer support pins 17 are fixed (e.g., fixedly installed) on the wafer table 10'. In other words, the wafer support pins 17 are not movable. In an alternative embodiment, the wafer support pins 17 are vertically movable on the wafer table 10', similar to the wafer support pins 16 on the wafer table 10. The wafer 70 may have a diameter of 200 mm, 300 mm, 450 mm, or another suitable size. The wafer 70 includes one or more layers of material or composition. In some embodiments, the wafer 70 includes an elementary semiconductor such as silicon or germanium; a compound semiconductor such as silicon germanium, silicon carbide, gallium arsenic, indium arsenide, gallium nitride, and indium phosphide; or an alloy semiconductor, such as silicon germanium carbide, gallium arsenic phosphide, and gallium indium phosphide. The wafer 70 may also comprise non-semiconductor materials including soda-lime glass, fused silica, fused quartz, calcium fluoride ($CaF_2$), metal layers, and/or other suitable materials. The wafer 70 may include silicon on insulator (SOI) substrate, be strained and/or stressed for performance enhancement, include epitaxial regions, include isolation regions, include doped regions, and/or include other suitable features and layers.

The wafer 70 has a first surface 72 and a second surface 74, wherein the pins 17 contact the second surface 74. The wafer 70 is not totally rigid and has certain flexibility. As illustrated in FIG. 5A, once being supported by the pins 17, the wafer surface 72 exhibits some bumps and dips (or ridges and valleys) due to the pins 17 propping up and the vacuum suction force pulling down. Particularly, the bumps are directly above the pins 17 and the dips are above the space between the pins 17.

At the operation 104, the method 100 (FIG. 4) forms a set of overlay marks 76 in one or more material layers in the wafer 70. This may include a variety of lithography processes such as resist coating, resist exposure, resist developing, material deposition, etching, and planarization. The overlay marks 76 are used for measuring overlay deviations between two layers on the wafer 70. The overlay marks 76 may be disposed in a cell region or a scribe line region of the wafer 70. The overlay marks 76 may be reflection-based or diffraction-based, and may have any suitable size, shape, and configuration, such as box-in-box, frame-in-frame, cross-in-box, box-in-bar, bar-in-bar, and diffraction gratings. In the present embodiment, each of the overlay marks 76 is formed directly over a pin 17 with its geometrical center line aligned with the geometric center line of the respective pin 17, such as illustrated in FIG. 5A. It is noted that, for simplicity purposes, FIG. 5A illustrates the overlay mark 76 without showing other features (e.g., doped regions, gates, contacts, interconnects, isolation, etc.) in the same layer as the overlay mark 76. Positioning the overlay marks 76 directly above the pins 17 may be important for reducing misalignment between layers and for reducing the number of wafer scraps due to excessive overlay errors.

At the operation 106, the method 100 (FIG. 4) transfers the wafer 70 onto a second wafer table having dynamic support pins that is an embodiment of the wafer table 10, as illustrated in FIG. 5B. It is noted that the second wafer table (hereinafter, wafer table 10) may be housed in a different process chamber than the wafer table 10'. The two process chambers may be used for depositing different layers onto the wafer 70. The dynamic support pins 16 of the wafer table 10 have a second pin pitch Y that is smaller than the pin pitch X. Because the wafer tables 10' and 10 have different pin pitches, the wafer surface 72 exhibits different ridges and valleys when supported by the wafer table 10 than by the wafer table 10'. Particularly, the overlay marks 76, which are formed to be aligned with the pins 17, may not be aligned with the pins 16. If the pins 16 were not dynamically movable, such misalignment between the overlay marks 76 and the pins 16 would have caused subsequent overlay marks to be offset from the overlay marks 76. Further, the misalignment between the overlay marks 76 and the pins 16 causes the overlay marks 76 to be slanted, which makes it difficult for subsequent overlay marks to align with the overlay marks 76. However, the dynamically movable pins 16 according to the present disclosure solve the above problem, as discussed below.

At the operation 108, the method 100 (FIG. 4) moves the individually movable pins 16 so that the pin pitch on the wafer table 10 substantially matches the pin pitch X, as illustrated in FIG. 5C. Referring to FIG. 5C, the method 100 lowers a subset of the pins 16 such that a remaining portion of the pins 16 that support the wafer 70 have the pin pitch X between adjacent pins. In an embodiment, the method 100 uses pin maps of the wafer tables 10' and 10 to decide which pins 16 are to be lowered. In another embodiment, the method 100 monitors one or more overlay marks 76 while adjusting the pins 16 so that the shape and orientation of the one or more overlay marks 76 match a predetermined shape and orientation. In an embodiment, the method 100 moves the dynamic support pins 16 using a controller built into the wafer table 10 or an external controller such as the controller 80 (FIG. 3).

At the operation 110, the method 100 (FIG. 4) forms a second set of overlay marks 78 onto one or more material layers in the wafer 70. This may include a variety of lithography processes such as resist coating, resist exposure, resist developing, material deposition, etching, and planarization. The overlay marks 78 are disposed directly above the overlay marks 76. In the present embodiment, the overlay marks 76 and 78 are vertically aligned with the pins 16, which advantageously reduces overlay errors and increases wafer yield. As can be seen from the above description, one benefit of the wafer table 10 is that it can be adapted to work with other wafer tables to reduce overlay errors when a wafer is transferred onto the wafer table 10.

Figure 6:
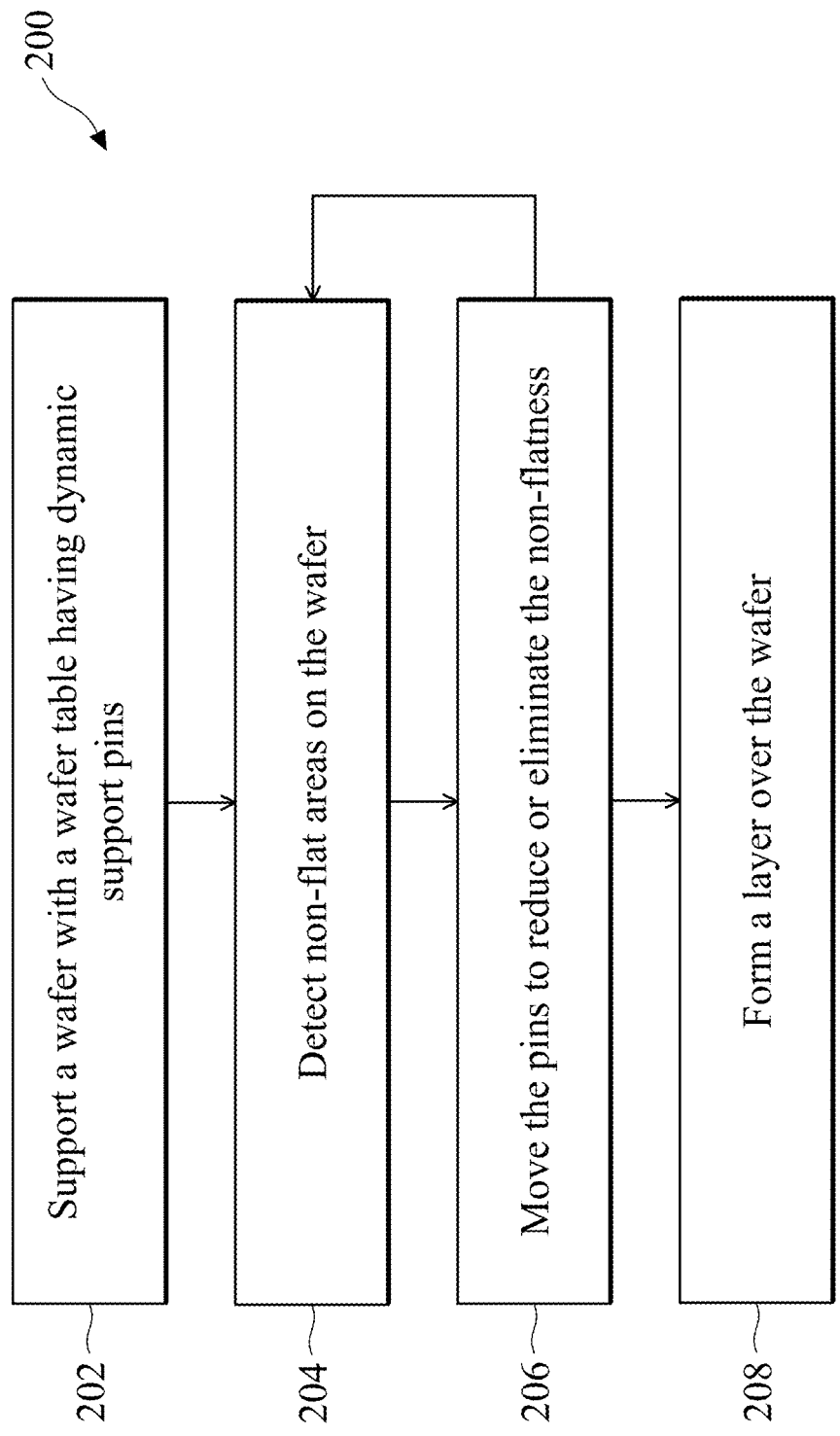
FIG. 6 shows a flow chart of another semiconductor fabrication process according to some aspects of the present disclosure that utilizes an embodiment of the wafer table of FIGS. 1A-1B.

FIG. 6 illustrates a flow chart of a method 200 for manufacturing one or more wafers according to aspects of the present disclosure, illustrating another application of the wafer table 10 for increasing wafer yield. In a brief overview, the method 200 includes an operation 202 to support a wafer with a wafer table having dynamic support pins, an operation 204 to detect non-flat areas (or non-flatness) on the wafer, an operation 206 to move the dynamic support pins on the wafer table to eliminate or reduce the non-flatness, and an operation 208 to form a layer on the wafer. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is further described below in conjunction with FIGS. 7A-7B and FIGS. 8A-8B.

At the operation 202, the method 200 (FIG. 6) supports a wafer 70 with the wafer table 10 having individually and vertically movable pins 16, such as illustrated in FIG. 7A and FIG. 8A. The wafer table 10 and the wafer 70 may be housed in a process chamber, such as the process chamber 50 (FIG. 3). The wafer 70 has a top surface 72 and a bottom surface 74. The pins 16 contact the bottom surface 74. In the present embodiment, once supported by the wafer table 10, the top surface 72 exhibits certain non-flatness in some areas 73 of the wafer 70 (non-flat areas 73). In an embodiment, the non-flatness may be caused by contamination, such as foreign particles or chemical residues adsorbed onto the bottom surface 74 or onto the wafer table 10, as illustrated in FIG. 7A. In another embodiment, the non-flatness may be caused by non-uniform thickness in various layers of the wafer 70, as illustrated in FIG. 8A. For example, when depositing material(s) onto the wafer 70, the material distribution may not be ideally even, causing bumps and/or dips in the top surface 72. If not dealt with properly, the non-flatness may cause subsequent layers to be misaligned or subsequent features to be tilted, thereby causing manufacture defects. As illustrated in FIGS. 7A and 8A, the non-flatness may cause an overlay mark 76 to be tilted or slanted, making it difficult for subsequent layers to be aligned with the current layer.

At the operation 204, the method 200 (FIG. 6) detects the non-flat areas 73 on the top surface 72. This may be performed by optical sensors or leveling sensors, such as the optical sensors 62 (FIG. 3). In an embodiment, the method 200 may scan the entire surface 72 and keep track of the coordinates, footprint sizes, and magnitudes of the bumps and dips on the surface 72. The detected non-flatness may be conveyed to a controller or computer, such as the controller 80 (FIG. 3), in a suitable file format such as a text file or an image file.

At the operation 206, the method 200 (FIG. 6) moves the pins 16 based on the detected non-flatness such that the non-flatness in the surface 72 may be reduced in magnitude or totally disappear. For example, if the non-flatness is a bump in the surface 72, the method 200 may reduce the height of one or more pins 16 under the bump to cause the bump to disappear in the surface 72, such as illustrated in FIGS. 7B and 8B. For another example, if the non-flatness is a dip in the surface 72, the method 200 may increase the height of one or more pins 16 under the dip. In an embodiment, the method 200 may perform the operations 204 and 206 in an iterative manner. For example, after the operation 206 has completed a round of pin movement based on a previously measured surface non-flatness, the method 200 may go back to the operation 204 to perform another non-flatness measurement or detection on the surface 72. Then, the newly measured non-flatness is used to further adjust the pins 16 in the operation 206. In some embodiments, the method 200 may repeat the operations 204 and 206 for multiple iterations until the non-flatness in the surface 72 is smaller than a threshold.

At the operation 208, the method 200 (FIG. 6) forms a layer on the wafer 70, particularly on the surface 72. For example, the operation 208 may be performed inside the process chamber 50 (FIG. 3). Because the surface 72 has been flattened by the operations 204 and 206, it becomes easier for this layer to be aligned with the previous layer (i.e., the overlay marks in the two layers are aligned), which advantageously improve the yield of the wafer 70. The method 200 may repeat the operations 204, 206, and 208 to form multiple layers over the wafer 70.

Figure 9:
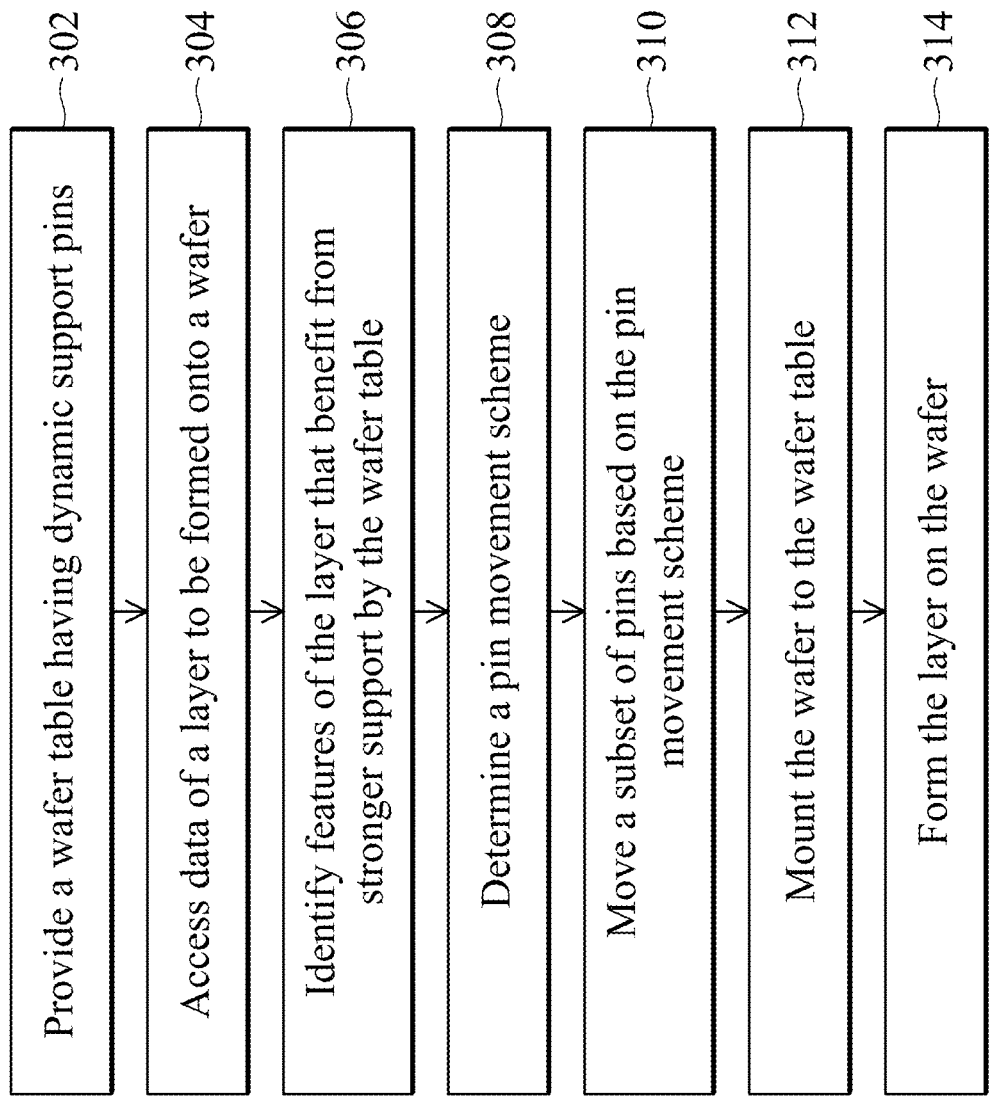
FIG. 9 shows a flow chart of yet another semiconductor fabrication process according to some aspects of the present disclosure that utilizes an embodiment of the wafer table of FIGS. 1A-1B.

FIG. 9 illustrates a flow chart of another method 300 that utilizes the innovative wafer table with dynamically adjustable pins according to the present disclosure. Unlike the method 200 which measures non-flatness on a wafer and adjusts the pins to counteract the measured non-flatness, the method 300 preemptively moves the pins based on features in a layer to be formed over a wafer. In other words, the method 300 creates a pin movement scheme corresponding to the next layer to be formed onto the wafer, and moves the pins accordingly. In some embodiments, the methods 200 and 300 may be jointly implemented by the same system for improving wafer yield. The method 300 includes operations 302, 304, 306, 308, 310, 312, and 314, which will be further discussed below. The method 300 is merely an example, and is not intended to limit the present disclosure beyond what is explicitly recited in the claims. Additional operations can be provided before, during, and after the method 300, and some operations described can be replaced, eliminated, or moved around for additional embodiments of the method.

At the operation 302, the method 300 (FIG. 9) provides a wafer table having dynamic support pins, such as the wafer table 10 with the dynamically adjustable pins 16. The wafer table 10 may be housed in a process chamber, such as the process chamber 50 (FIG. 3). At the operation 304, the method 300 accesses data of a layer to be formed on the wafer. This may be implemented by a controller or computer, such as the controller 80 (FIG. 3).

At the operation 306, the method 300 identifies features of the layer that benefit from relatively stronger support by the wafer table than other features in the same layer. For example, the identified features may have lower tolerance of overlay errors than other features in the same layer. For example, the identified features may include vertical metal features (e.g., metal feature 92 in FIGS. 10A and 10B) that may tend to collapse or tilt if not strongly supported directly from below. For another example, the identified features may include overlay marks (e.g., overlay marks 76 in FIGS. 10A and 10B). As discussed above, misalignment between overlay marks (overlay errors) may reduce the wafer yield. For yet another example, the identified features may include relatively heavier circuit features (e.g., circuit feature 94 in FIG. 10A and circuit features 96 and 98 in FIG. 10B). In an embodiment, the operation 306 may be implemented by a controller or computer, such as the controller 80 (FIG. 3).

At the operation 308, the method 300 (FIG. 9) determines a scheme of moving the pins 16 on the wafer table 10 ("pin movement scheme"). In an embodiment, the pin movement scheme is created based on the coordinates of the identified features, the size of the pins 16, the pin pitch on the wafer table 10, and/or other information. The pin movement scheme notes down which pins 16 are to be raised and which pins 16 are to be lowered. In an embodiment, the operation 308 may be implemented by a controller or computer, such as the controller 80 (FIG. 3).

At the operation 310, the method 300 (FIG. 9) moves the pins 16 based on the pin movement scheme. This may be implemented by a controller or computer, such as the controller 80 (FIG. 3) or a controller (not shown) built into the wafer table 10.

Figure 10A:
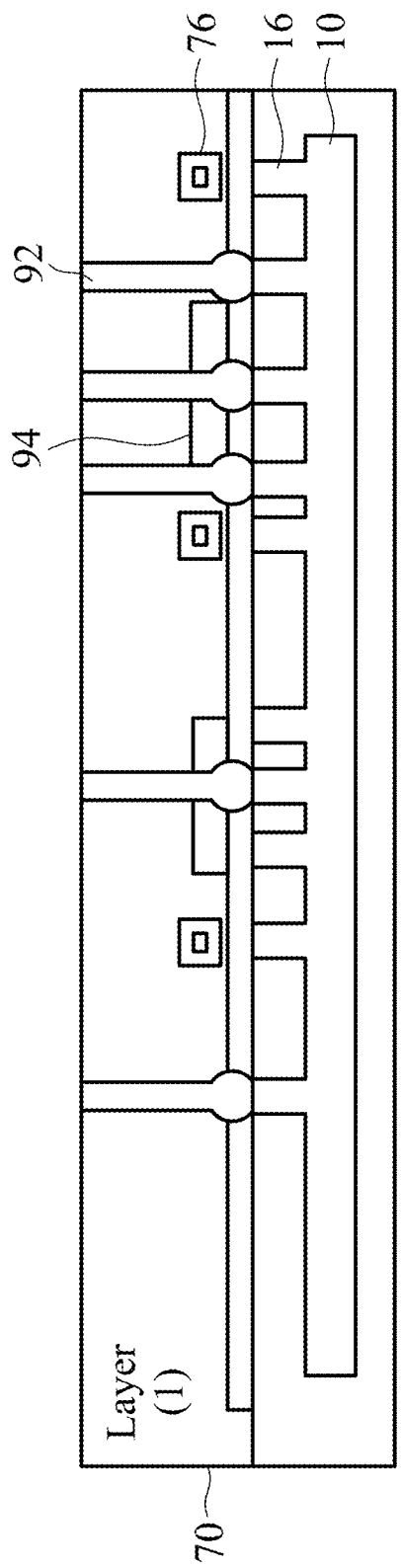
FIGS. 10A and 10B illustrate some operations of the method of FIG. 9, in accordance with some embodiments.
Figure 10B:
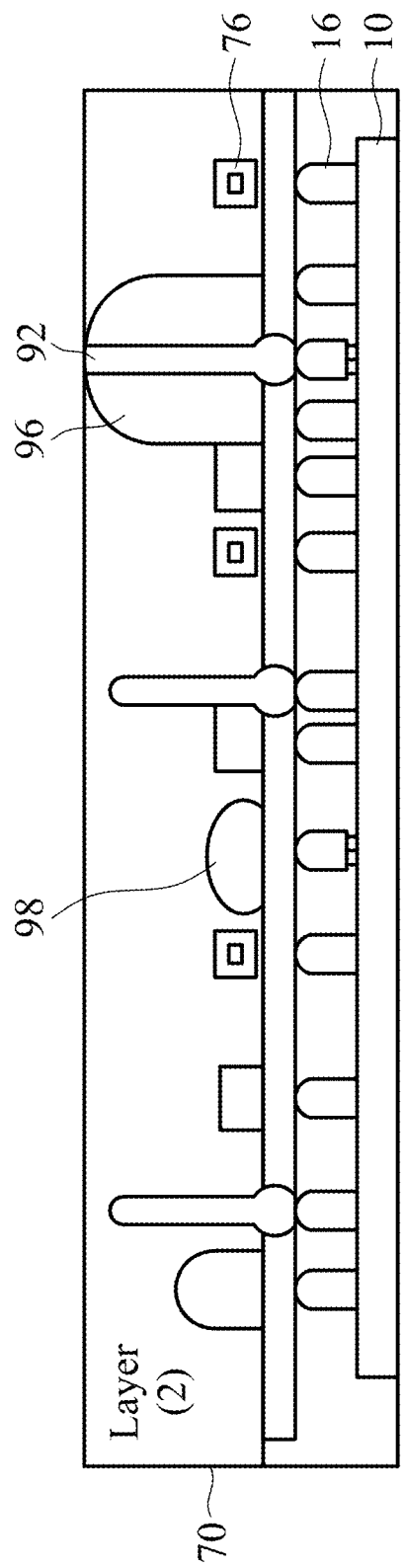

At the operation 312, the method 300 (FIG. 9) mounts the wafer (wafer 70) onto the wafer table 10, such as illustrated in FIGS. 10A and 10B, where a subset of the pins 16 may have been raised and another subset of the pins 16 may have been lowered by the operation 310.

At the operation 314, the method 300 (FIG. 9) forms the layer on the wafer 70, such as illustrated in FIGS. 10A and 10B, where the features identified in the operation 306 are formed directly above the raised subset of the pins 16. Since these features are directly supported by the pins 16, the wafer 70 obtains a stable support by the wafer table 10 during the various processes of forming the features.

Although not intended to be limiting, one or more embodiments of the present disclosure provide many benefits to wafer fabrication. In an embodiment, a wafer table is designed to have individually and vertically movable pins that are evenly distributed across an entire area equal to or larger than a wafer supported by the wafer table. The movable pins can be dynamically adjusted to match a support pin pitch of a different wafer table, to counteract surface non-flatness in the wafer, and to selectively support certain features in the wafer including overlay marks. Using the wafer table of the present disclosure, a semiconductor manufacturer can ensure a flat surface in a wafer, thereby reducing misalignment between layers sequentially formed on the wafer.

In one exemplary aspect, the present disclosure is directed to a method for semiconductor fabrication. The method includes mounting a wafer onto a first wafer table, wherein the first wafer table includes a first set of pins that support the wafer, the first set of pins having a first pitch between adjacent pins. The method further includes forming a first set of overlay marks on the wafer; and transferring the wafer onto a second wafer table. The second wafer table includes a second set of pins having a second pitch between adjacent pins. The second set of pins are individually and vertically movable. The second pitch is smaller than the first pitch. The method further includes moving a portion of the second set of pins such that a remaining portion of the second set of pins supports the wafer and the remaining portion has the first pitch between adjacent pins.

In an embodiment of the method, each of the first set of overlay marks is formed directly over one of the first set of pins. In another embodiment, each of the first set of overlay marks is directly over one of the remaining portion of the second set of pins.

In an embodiment, the method further includes forming a second set of overlay marks on the wafer, wherein each of the second set of overlay marks is directly over each of the first set of overlay marks. In another embodiment of the method, each of the first set of pins is fixedly installed on the first wafer table. In yet another embodiment of the method, some of the first set of pins is movable on the first wafer table.

In another exemplary aspect, the present disclosure is directed to a method for semiconductor fabrication. The method includes supporting a wafer with a wafer table, wherein the wafer table includes a set of pins that are individually and vertically movable, the set of pins contacting a first side of the wafer. The method further includes detecting a non-flat area on a second side of the wafer opposite the first side; and moving at least one of the set of pins to cause the non-flat area to become flat on the second side of the wafer.

In an embodiment of the method, the non-flat area is a dip on the second side of the wafer. In a further embodiment, the moving includes raising a height of the at least one of the set of pins underneath the dip.

In another embodiment of the method, the non-flat area is a bump on the second side of the wafer. To further this embodiment, the moving includes reducing a height of the at least one of the set of pins underneath the bump.

In an embodiment of the method, the detecting is performed with one or more optical leveling sensors. In another embodiment, the moving includes: adjusting a height of the at least one of the set of pins; measuring a flatness of the non-flat area on the second side of the wafer; and re-adjusting the height of the at least one of the set of pins based on a result of the measuring.

In an embodiment of the method, the non-flat area is caused by one or more foreign particles on the first side of the wafer. In another embodiment, the non-flat area is caused by thickness non-uniformity of one or more layers deposited on the wafer.

In another exemplary aspect, the present disclosure is directed to a method for fabricating a wafer. The method includes providing a wafer table, wherein the wafer table includes a set of pins that are individually and vertically movable; accessing data regarding a layer to be formed onto a first side of the wafer; identifying, from the data, a set of features in the layer that benefit from stronger support by the wafer table than other features; determining, based on at least the data and the set of features, a pin movement scheme for moving the set of the pins such that the set of features in the layer are to be directly above a first subset of the pins; moving the set of pins based on the pin movement scheme; mounting the wafer onto the wafer table with the first subset of the pins contacting a second side of the wafer opposite the first side; and forming the layer onto the first side of the wafer.

In an embodiment of the method, the set of features have a lower tolerance of overlay errors than the other features. In another embodiment, the set of features include vertical metal features. In an embodiment, the determining includes calculating coordinates on the wafer table that map to geometric centers of each of the set of features.

In an embodiment of the method, the moving includes reducing a height of a second subset of the pins, wherein the first subset and the second subset are complementary. In another embodiment, the moving includes raising a height of the first subset of the pins to be higher than other pins in the set of pins.

In another exemplary aspect, the present disclosure is directed to a wafer table. The wafer table includes a plate. A top surface of the plate includes a circular area that is greater than a size of a silicon wafer. The circular area has holes that are evenly distributed across an entire area of the circular area. The wafer table further includes wafer support pins, wherein each of the wafer support pins is vertically movable in one of the holes. The wafer table further includes a mechanism underneath the wafer support pins and configured to vertically move each of the wafer support pins individually.

In an embodiment of the wafer table, the mechanism includes MEMS (Micro Electro Mechanical System) structures, wherein each of the MEMS structures is under one of the wafer support pins and is configured to cause vertical movement in the one of the wafer support pins. In a further embodiment, each of the MEMS structures is configured to change its volume based on a voltage applied to it, and the change in its volume causes the vertical movement in the respective wafer support pin. In another further embodiment, each of the MEMS structures includes a MEMS magnetic actuator. Further, each of the wafer support pins may include silicon carbide.

In another exemplary aspect, the present disclosure is directed to a system for wafer fabrication. The system includes a wafer table configured to support a wafer thereon. The wafer table includes a set of wafer support pins that are individually and vertically movable, the set of wafer support pins contacting a first surface of the wafer. The system further includes one or more leveling sensors configured to detect non-flatness of a second surface of the wafer opposite the first surface; and a controller configured to adjust a height of the set of wafer support pins based on a measurement result by the one or more leveling sensors so that the non-flatness of the second surface of the wafer disappears as a result of the adjusting. In an embodiment of the system, the controller is further configured to adjust the height of the set of wafer support pins based on locations of overlay marks on the wafer.

In yet another exemplary aspect, the present disclosure is directed to a system for wafer fabrication. The system includes a wafer table configured to support a wafer thereon. The wafer table includes a set of wafer support pins that are individually and vertically movable, the set of wafer support pins contacting a first surface of the wafer. The system further includes a controller configured to read data of a next layer to be formed over a second surface of the wafer opposite the first surface, to identify a set of features in the next layer that benefit from stronger support by the wafer table than other features, and to adjust a height of the set of wafer support pins so that each of the set of features, when formed, is to be directly above one of the wafer support pins. The system further includes a process chamber configured to form the next layer over the second surface of the wafer. In an embodiment of the system, the wafer table provides a circular area that is greater than a size of the wafer, and wherein the wafer support pins are evenly placed in the circular area.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor fabrication, comprising:
supporting a wafer with a wafer table, wherein the wafer table includes a set of pins that are individually and vertically movable, the set of pins having closed upper surfaces contacting a first side of the wafer;
detecting non-flatness in an area on a second side of the wafer opposite the first side based on an overlay mark disposed in the area on the second side of the wafer, the overlay mark being positioned directly over a pin of the set of pins such that a geometrical center line of the overlay mark is aligned with a geometrical center line of the pin;
moving at least one of the set of pins such that the wafer is supported by the set of pins in a non-planar configuration to cause the non-flatness to become smaller than a threshold on the second side of the wafer; and
with the set of pins in the non-planar configuration to cause the non-flatness to become smaller, forming a layer on the wafer.

2. The method of claim 1, wherein the non-flatness in the area is caused by a dip on the second side of the wafer.

3. The method of claim 2, wherein the moving includes raising a height of the at least one of the set of pins underneath the dip.

4. The method of claim 1, wherein the non-flatness in the area is caused by a bump on the second side of the wafer.

5. The method of claim 4, wherein the moving includes reducing a height of the at least one of the set of pins underneath the bump.

6. The method of claim 1, wherein the detecting is performed with one or more optical leveling sensors.

7. The method of claim 1, wherein the moving includes:
adjusting a height of the at least one of the set of pins;
measuring a flatness of the area on the second side of the wafer; and
re-adjusting the height of the at least one of the set of pins based on a result of the measuring.

8. The method of claim 1, wherein the non-flatness in the area is caused by one or more foreign particles on the first side of the wafer.

9. The method of claim 1, wherein the non-flatness in the area is caused by thickness non-uniformity of one or more layers deposited on the wafer.

10. A method, comprising:
providing a wafer table, wherein the wafer table includes a set of wafer support pins that are individually and vertically movable;
mounting a wafer onto the wafer table, wherein upper surfaces of support pins of the set of wafer support pins physically contact a first surface of the wafer, the upper surfaces being sealed surfaces enclosing interior regions of the support pins;
detecting non-flatness of a second surface of the wafer opposite the first surface based on an overlay mark disposed on the second surface of the wafer, the overlay mark being positioned directly over a wafer support pin from the set of wafer support pins such that a geometrical center line of the overlay mark is aligned with a geometrical center line of the wafer support pin;
adjusting a height of at least one of the set of wafer support pins based on a result of the detecting such that the non-flatness of the second surface of the wafer is reduced; and
performing a fabrication process on the wafer with the height of the at least one of the set of wafer support pins adjusted such that the non-flatness of the second surface of the wafer is reduced.

11. The method of claim 10, wherein the wafer table provides a circular area that is greater than a size of the wafer, and wherein the set of wafer support pins are evenly placed across the circular area.

12. The method of claim 10, wherein the adjusting of the height of the at least one of the set of wafer support pins includes reducing the height of the at least one of the set of wafer support pins.

13. The method of claim 10, wherein the adjusting of the height of the at least one of the set of wafer support pins includes raising the height of the at least one of the set of wafer support pins.

14. The method of claim 10, wherein the overlay mark includes a plurality of overlay marks, and
wherein the detecting of the non-flatness is based on locations of the plurality of overlay marks on the wafer.

15. A method, comprising:
mounting a wafer onto a wafer table, wherein the wafer table includes a plurality of pins that are individually movable, the plurality of pins contacting a bottom side of the wafer;
measuring a non-flat area on a top side of the wafer based on a plurality of overlay marks disposed on the top side of the wafer, a respective overlay mark of the plurality of overlay marks being positioned directly over a respective pin of the plurality of pins such that a geometrical center line of the respective overlay mark is aligned with a geometrical center line of the respective pin;
moving a subset of the plurality of pins to cause the non-flat area to become flat on the top side; and
forming a material layer on the top side of the wafer with the subset of the plurality of pins moved to cause the non-flat area to become flat on the top side.

16. The method of claim 15, wherein each of the plurality of pins is vertically moveable.

17. The method of claim 15, wherein the moving includes raising a height of the subset of the plurality of pins to be higher than other pins of the plurality of pins.

18. The method of claim 15, wherein each of the plurality of pins includes silicon carbide.

19. The method of claim 15, wherein the measuring of the non-flat area includes conveying a non-flatness of the non-flat area to a controller in a text file format.

20. The method of claim 10, wherein the detecting of the non-flatness of the second surface of the wafer opposite the first surface based on the overlay mark disposed on the second surface of the wafer includes detecting either a recess formed in the second surface of the wafer or a bump on the second surface of the wafer.

* * * * *